(12) United States Patent  
Chen

(10) Patent No.: US 8,199,575 B2  
(45) Date of Patent: Jun. 12, 2012

(54) MEMORY CELL ARRAY OF MEMORY

(75) Inventor: Chung-Kuang Chen, Pan Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 371 days.

(21) Appl. No.: 12/684,498

(22) Filed: Jan. 8, 2010

(65) Prior Publication Data

US 2011/0170351 A1 Jul. 14, 2011

(51) Int. Cl.
*G11C 11/34* (2006.01)

(52) U.S. Cl. ......... 365/185.13; 365/185.18; 365/185.16; 365/185.11; 365/185.17

(58) Field of Classification Search ............. 365/185.13, 365/185.18, 185.16, 185.11, 185.17
See application file for complete search history.

(56) References Cited

U.S. PATENT DOCUMENTS

| 8,072,811 | B2 * | 12/2011 | Lee et al. | 365/185.17 |
| 8,077,496 | B2 * | 12/2011 | Choi | 365/148 |
| 8,120,966 | B2 * | 2/2012 | Lee | 365/185.22 |
| 2010/0118593 | A1 * | 5/2010 | Cho et al. | 365/148 |

* cited by examiner

*Primary Examiner* — Fernando Hidalgo
(74) *Attorney, Agent, or Firm* — Thomas|Kayden

(57) ABSTRACT

A memory cell array of a memory comprises a main memory cell array, including local bit lines, word lines and memory cells, and a selected array, including a global bit line, a bit line transistor (BLT) control line, a transistor and a fixed value memory cell. The local bit lines comprise first and second local bit lines. Each memory cell for storing data corresponds and is connected to one local bit line and one word line. The transistor is coupled to the global bit line, first local bit line and BLT control line, and selectively turns on to connect the global bit line to the first local bit line. The fixed value memory cell coupled to the global bit line, second local bit line, and BLT control line is programmed to a fixed value so that a threshold voltage thereof is greater than a threshold voltage of the transistor.

20 Claims, 13 Drawing Sheets

MEMORY CELL ARRAY OF MEMORY

BACKGROUND OF THE INVENTION

1. Field of the Invention

The invention relates in general to a memory, and more particularly to a memory cell of a memory using array cells to form bit line transistors (BLTs).

2. Description of the Related Art

FIG. 1 (Prior Art) is an equivalent circuit diagram showing a portion of a memory cell array 10. Referring to FIG. 1, the memory cell array 10 includes a memory cell 150, bit line transistors (BLTs) 131 to 138, BLT control lines 141 to 148, word lines 161 and 162, a global word line 112, a global word line 114, a global word line 116, a global word line 118 and local bit lines 121 to 128. The bit line transistors 131 to 138 control to select which local bit line for the programming operation, and the bit line transistors 131 to 138 are respectively controlled by the BLT control lines 141 to 148.

However, the conventional bit line transistor is a metal-oxide semiconductor (MOS) transistor, so the circuit layout area of the of the bit line transistor cannot be reduced due to the limitations of the contact holes and the manufacturing processes of the MOS transistor.

SUMMARY OF THE INVENTION

The invention is directed to a memory cell array of a memory, in which an array cell is used to replace a conventional MOS transistor so that a circuit layout area of bit line transistors (BLTs) may be reduced.

According to the present invention, a memory cell array of a memory is provided. The memory cell array comprises a main memory cell array and a selected array. The main memory cell array comprises local bit lines, word lines, and memory cells. The selected array comprises a global bit line, a bit line transistor control line, a transistor, and a fixed value memory cell. The local bit lines comprise first and second local bit lines. Each memory cell for storing data corresponds to and is connected to one local bit line and one word line. The transistor is coupled to the global bit line, the first local bit line and the bit line transistor control line, and selectively turns on to connect the global bit line to the first local bit line. The fixed value memory cell is coupled to the global bit line, the second local bit line, and the bit line transistor control line and programmed to a fixed value so that a threshold voltage of the fixed value memory cell is greater than a threshold voltage of the transistor.

The invention will become apparent from the following detailed description of the preferred but non-limiting embodiments. The following description is made with reference to the accompanying drawings.

DETAILED DESCRIPTION OF THE INVENTION

In order to reduce the circuit layout area of the bit line transistors, the following embodiments disclose the utilization of an array cell to replace the conventional MOS transistor. The memory includes global bit lines, local bit lines, word lines, bit line transistor (BLT) control lines, a memory cell array and a bit line select circuit. The memory cell array includes a plurality of memory cells defined by the local bit lines and the word lines interlaced with the local bit lines. The bit line select circuit includes a plurality of array cells defined by the global bit lines, the local bit lines and the BLT control lines, which are interlaced with one another. One portion of the array cells is programmed and data storage layers (charge trapping layers) of another portion of the array cells are removed to form a plurality of bit line transistors. Because the bit line transistors are implemented by the array cells and are not implemented by the MOS transistors, the circuit layout area of the bit line transistors may be greatly reduced.

First Embodiment

Figure 1:
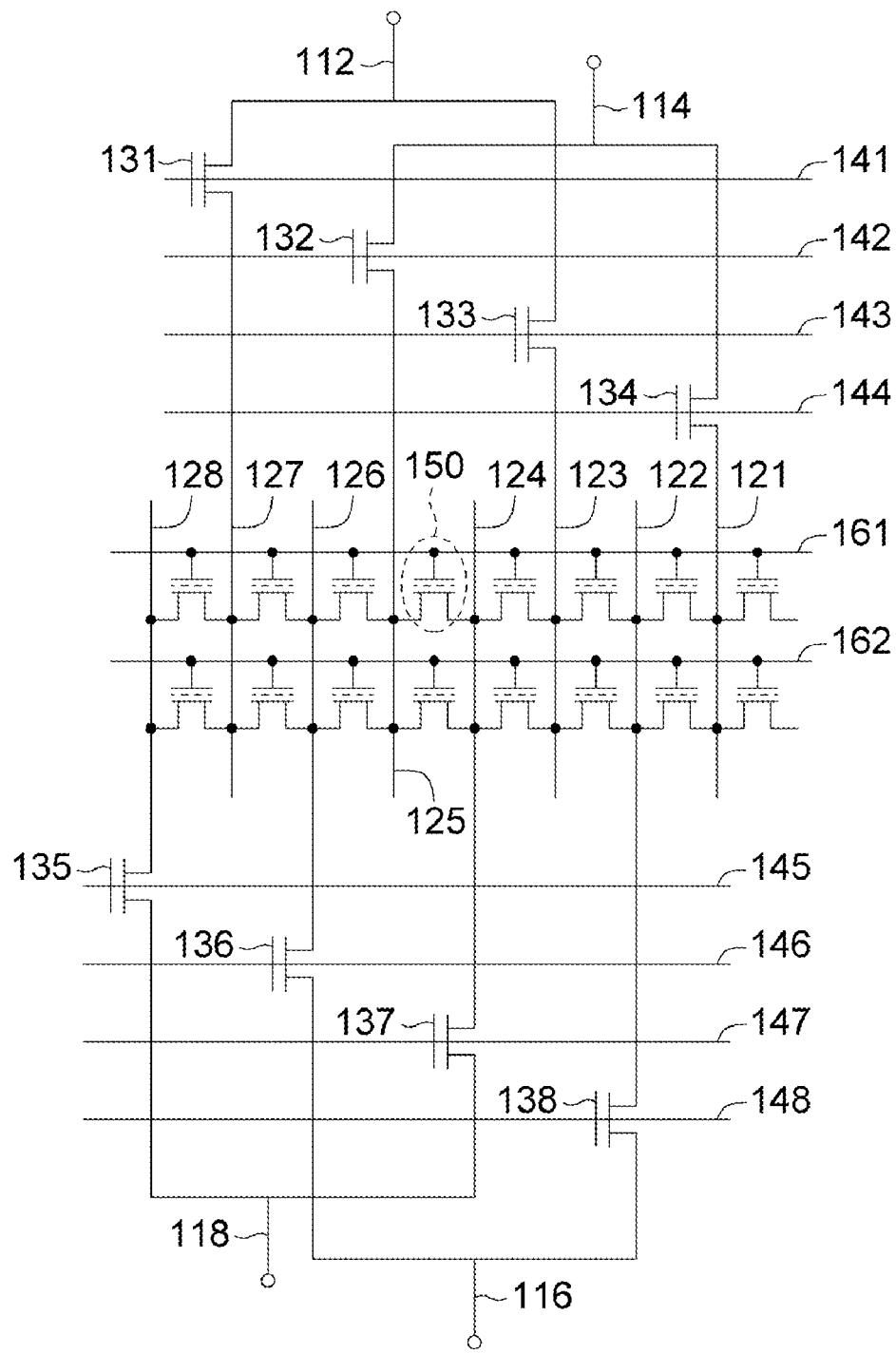
FIG. 1 (Prior Art) is an equivalent circuit diagram showing a portion of a memory cell array.
Figure 2:
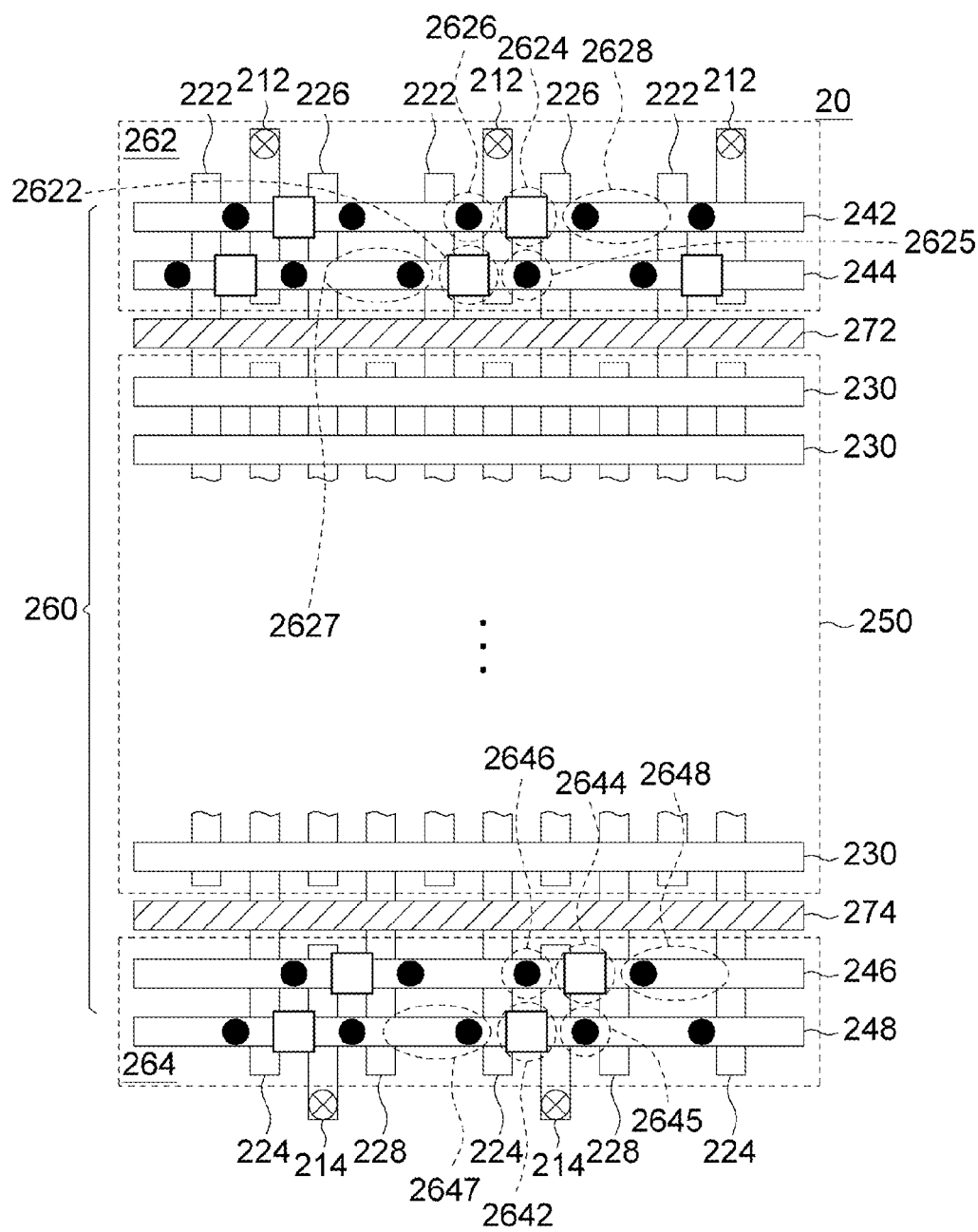
FIG. 2 is a schematic illustration showing a partial circuit layout of a memory cell array according to a first embodiment of the invention.
Figure 3:
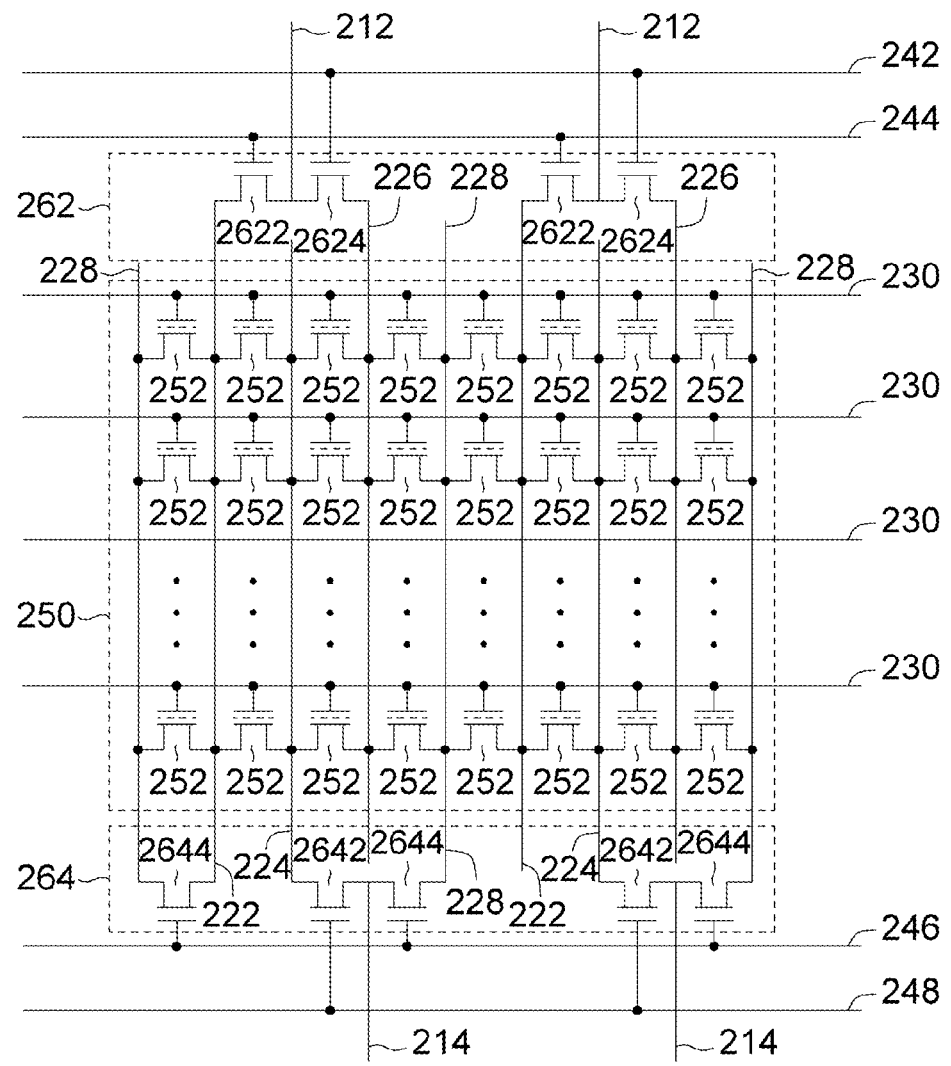
FIG. 3 is an equivalent circuit diagram showing a portion of the memory cell array according to the first embodiment of the invention.

FIG. 2 is a schematic illustration showing a partial circuit layout of a memory cell array 20 of a memory according to a first embodiment of the invention. FIG. 3 is an equivalent circuit diagram showing a portion of the memory cell array of the memory according to the first embodiment of the invention. As shown in FIGS. 2 and 3, the memory cell array 20 of the memory is a virtual ground array memory, for example. The memory cell array 20 includes a main memory cell array 250 and a selected array 260. The main memory cell array 250 includes local bit lines 222, local bit lines 224, local bit lines 226, local bit lines 228, word lines 230 and memory cells. Each memory cell for storing data corresponds to and is connected to one of the local bit lines and one of the word lines.

The selected array 260 includes a bit line select unit 262 and a bit line select unit 264. The local bit lines 222 and the local bit lines 226 extend from the main memory cell array 250 to the bit line select unit 262, while the local bit lines 224 and the local bit lines 228 extend from the main memory cell array 250 to the bit line select unit 264. The bit line select unit 262 includes global bit lines 212, BLT control lines 242, BLT control lines 244, transistors 2622, transistors 2624 and fixed value memory cells 2625 to 2628. Each of the fixed value memory cells 2625 to 2628 has a layout structure including a data storage layer, and each of the transistors 2622 and 2624 has a layout structure similar to the layout structure of each of the fixed value memory cell s2625 to 2628 except for the data storage layer of each of the fixed value memory cells 2625 to 2628. The bit line select unit 264 includes global bit lines 214, BLT control lines 246, BLT control lines 248, transistors 2642, transistors 2644 and fixed value memory cells 2645 to 2648. Each of the fixed value memory cells 2645 to 2648 has a layout structure including a data storage layer, and each of the transistors 2642 and 2644 has a layout structure similar to the layout structure of each of the fixed value memory cells 2645 to 2648 except for the data storage layer of each of the fixed value memory cells 2645 to 2648.

The global bit lines 212, the global bit lines 214, the local bit lines 222, the local bit lines 224, the local bit lines 226 and the local bit lines 228 are arranged in parallel. The word lines 230, the BLT control line 242, the BLT control line 244, the BLT control line 246 and the BLT control line 248 are arranged in parallel. The global bit lines 212, the global bit lines 214, the local bit lines 222, the local bit lines 224, the local bit lines 226 and the local bit lines 228 are perpendicular to the word lines 230, the BLT control line 242, the BLT control line 244, the BLT control line 246 and the BLT control line 248.

The global bit lines 212 face the local bit lines 224 and are interlaced with the BLT control line 242 and the BLT control line 244. The global bit lines 212 and the local bit lines 224 are respectively disposed on two sides of the virtual word line 272, and disposed between the local bit lines 222 and the local bit lines 226. The global bit lines 214 face the local bit lines 226 and are interlaced with the BLT control line 246 and the BLT control line 248. The global bit lines 214 and the local bit lines 226 are respectively disposed on two sides of the virtual word line 274, and disposed between the local bit lines 224 and the local bit lines 228.

The local bit lines 222 are interlaced with the BLT control line 242, the BLT control line 244, the virtual word line 272 and the word lines 230, and the local bit lines 228 are interlaced with the BLT control line 246, the BLT control line 248, the virtual word line 274 and the word lines 230. The local bit lines 224 respectively face the global bit lines 212 and are interlaced with the BLT control line 246, the BLT control line 248, the virtual word line 274 and the word lines 230. The local bit lines 226 respectively face the global bit lines 214 and are interlaced with the BLT control line 242, the BLT control line 244, the virtual word line 272 and the word lines 230.

Each of the transistor 2622, the fixed value memory cell 2627 and the fixed value memory cell 2625 has a gate extended from the BLT control line 244, and the transistor 2622 does not has the data storage layer of the fixed value memory cell 2625. Each of the transistor 2624, the fixed value memory cell 2626 and the fixed value memory cell 2628 has a gate extended from the BLT control line 242, and the transistor 2624 does not has the data storage layer of the fixed value memory cell 2626. The transistor 2622 is coupled to the global bit line 212, the local bit line 222 and the BLT control line 244 and may be controlled by the BLT control line 244 to selectively turn on to connect the global bit line 212 to the local bit line 222. The transistor 2624 is coupled to the global bit line 212, the local bit line 226 and the BLT control line 242 and may be controlled by the BLT control line 242 to selectively turn on to connect the global bit line 212 to the local bit line 226.

The fixed value memory cell 2625 is coupled to the global bit line 212, the local bit line 226 and the BLT control line 244 and programmed to a fixed value such that its threshold voltage is greater than the threshold voltage of the transistor 2622. The fixed value memory cell 2626 is coupled to the global bit line 212, the local bit line 222 and the BLT control line 242 and programmed to a fixed value such that its threshold voltage is greater than the threshold voltage of the transistor 2624. The fixed value memory cell 2627 is coupled to the local bit line 222, the local bit line 226 and the BLT control line 244 and programmed to a fixed value such that its threshold voltage is greater than the threshold voltage of the transistor 2622. The fixed value memory cell 2628 is coupled to the local bit line 226, the local bit line 222 and the BLT control line 242 and programmed to a fixed value such that its threshold voltage is greater than the threshold voltage of the transistor 2624.

Similarly, each of the transistor 2642, the fixed value memory cell 2647 and the fixed value memory cell 2645 has a gate extended from the BLT control line 248, and the transistor 2642 does not has the data storage layer of the fixed value memory cell 2645. Each of the transistor 2644, the fixed value memory cell 2646 and the fixed value memory cell 2688 has a gate extended from the BLT control line 246, and the transistor 2644 does not has the data storage layer of the fixed value memory cell 2646. The transistor 2642 is coupled to the global bit line 214, the local bit line 224 and the BLT control line 248 and may be controlled by the BLT control line 248 to selectively turn on to connect the global bit line 214 to the local bit line 224. The transistor 2644 is coupled to the global bit line 214, the local bit line 228 and the BLT control line 246 and may be controlled by the BLT control line 246 to selectively turn on to connect the global bit line 214 to the local bit line 228.

The fixed value memory cell 2645 is coupled to the global bit line 212, the local bit line 228 and the BLT control line 248 and programmed to a fixed value such that its threshold voltage is greater than the threshold voltage of the transistor 2642. The fixed value memory cell 2646 is coupled to the global bit line 212, the local bit line 224 and the BLT control line 246 and programmed to a fixed value such that its threshold voltage is greater than the threshold voltage of the transistor 2644. The fixed value memory cell 2647 is coupled to the local bit line 224, the local bit line 228 and the BLT control line 248 and programmed to a fixed value such that its threshold voltage is greater than the threshold voltage of the transistor 2642. The fixed value memory cell 2648 is coupled to the local bit line 228, the local bit line 224 and the BLT control line 246 and programmed to a fixed value such that its threshold voltage is greater than the threshold voltage of the transistor 2644.

In other words, the bit line select unit 262 includes several array cells defined by the local bit lines 222, the local bit lines 226, the global bit lines 212, the BLT control line 242 and the BLT control line 244, which are interlaced with one another. The bit line select unit 264 includes several array cells defined by the global bit lines 214, the local bit lines 224, the local bit lines 228, the BLT control line 246 and the BLT control line 248, which are interlaced with one another. The virtual word line 272 is disposed between the bit line select unit 262 and the main memory cell array 250, and the virtual word line 274 is disposed between the bit line select unit 264 and the main memory cell array 250. The BLT control line 242 and the BLT control line 244 are disposed on one side of the main memory cell array 250, and the BLT control line 246 and the BLT control line 248 are disposed on another side of the main memory cell array 250.

The array cells defined by the local bit lines 222, the local bit lines 226 and the BLT control line 244, which are interlaced with one another, and the array cells defined by the global bit lines 212, the local bit lines 226 and the BLT control line 244, which are interlaced with one another, are programmed. Data storage layers of the array cells defined by the global bit lines 212, the local bit lines 222 and the BLT control line 244, which are interlaced with one anther, are removed to form bit line transistors 2622. The array cells defined by the local bit lines 222, the local bit lines 226 and the BLT control line 242, which are interlaced with one another, and the array cells defined by the global bit lines 212, the local bit lines 226 and the BLT control line 242, which are interlaced with one another, are programmed. Data storage layers of the array cells defined by the global bit lines 212, the local bit lines 226 and the BLT control line 242, which are interlaced with one another, are removed to form bit line transistors 2624.

The array cells defined by the local bit lines 224, the local bit lines 228 and the BLT control line 248, which are interlaced with one another, and the array cells defined by the global bit lines 214, the local bit lines 228 and the BLT control line 248, which are interlaced with one another, are programmed. The data storage layers of the array cells defined by the global bit lines 214, the local bit lines 224 and the BLT control line 248, which are interlaced with one another, are removed to form bit line transistors 2642. The array cells defined by the local bit lines 224, the local bit lines 228 and the BLT control line 246, which are interlaced with one another, and the array cells defined by the global bit lines 214, the local bit lines 224 and the BLT control line 246, which are interlaced with one another, are programmed. The data storage layers of the array cells defined by the global bit lines 214, the local bit lines 228 and the BLT control line 246, which are interlaced with one another, are removed to form bit line transistors 2644.

For the sake of illustration, the programmed array cell is represented by the symbol "●", and the array cell without the data storage layer is represented by the symbol "□" in the subsequent drawings. The data storage layer is, for example, an oxide/nitride/oxide (ONO) layer, and the programming is, for example, the Fowler-Nordheim (FN) programming. The so-called Fowler-Nordheim programming represents that the positive voltage ranging from 15 to 20 volts is applied to the bit line transistor control line, and the negative voltage is applied to the base.

Because the bit line transistors 2622, the bit line transistors 2624, the bit line transistors 2642 and the bit line transistors 2644 are implemented by the array cells rather than the conventional MOS transistors, the circuit layout area of the bit line transistors may be greatly reduced.

Second Embodiment

Figure 4:
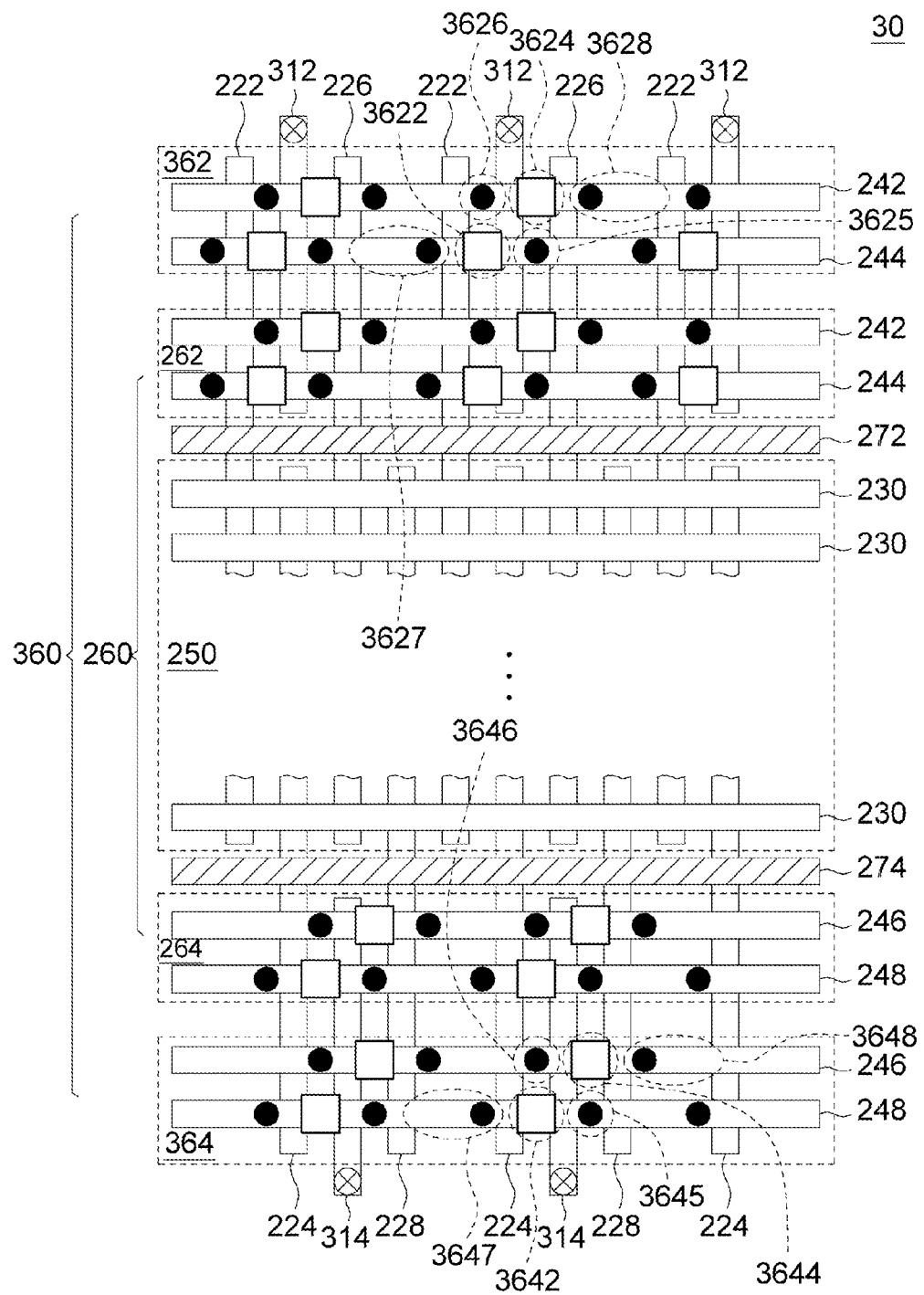
FIG. 4 is a schematic illustration showing a partial circuit layout of a memory cell array according to a second embodiment of the invention.

FIG. 4 is a schematic illustration showing a partial circuit layout of a memory cell array 30 of a memory according to a second embodiment of the invention. As shown in FIG. 4, the differences between the memory cell array 30 and the memory 20 will be described in the following. The memory cell array 30 further includes a backup selected array 360. The backup selected array 360 includes a backup bit line select unit 362 and a backup bit line select unit 364. When the bit line select unit 262 fails, the backup bit line select unit 362 is adopted to replace the failed bit line select unit 262. Similarly, when the bit line select unit 264 fails, the backup bit line select unit 364 is adopted to replace the failed bit line select unit 264.

The backup bit line select unit 362 includes a global bit line 312, a BLT control line 242, a BLT control line 244, a transistor 3622, a transistor 3624 and fixed value memory cells 3625 and 3627. Each of the transistor 3622, the fixed value memory cell 3627 and the fixed value memory cell 3625 has a gate extended from the BLT control line 344, and the transistor 3622 does not has the data storage layer of the fixed value memory cell 3625. The transistor 3624, the fixed value memory cell 3626 and the fixed value memory cell 3628 has a gate extended from the BLT control line 342, and the transistor 3624 does not has the data storage layer of the fixed value memory cell 3626. The transistor 3622 is coupled to the global bit line 312, the local bit line 222 and the BLT control line 344 and may be controlled by the BLT control line 344 to selectively turn on to connect the global bit line 312 to the local bit line 222. The transistor 3624 is coupled to the global bit line 312, the local bit line 226 and the BLT control line 342 and may be controlled by the BLT control line 342 to selectively turn on to connect the global bit line 312 to the local bit line 226.

The fixed value memory cell 3625 is coupled to the global bit line 312, the local bit line 226 and the BLT control line 344 and programmed to a fixed value such that its threshold voltage is greater than the threshold voltage of the transistor 3622. The fixed value memory cell 3626 is coupled to the global bit line 312, the local bit line 222 and the BLT control line 342 and programmed to a fixed value such that its threshold voltage is greater than the threshold voltage of the transistor 3624. The fixed value memory cell 3627 is coupled to the local bit line 222, the local bit line 226 and the BLT control line 344 and programmed to a fixed value such that its threshold voltage is greater than the threshold voltage of the transistor 3622. The fixed value memory cell 3628 is coupled to the local bit line 226, the local bit line 222 and the BLT control line 342 and programmed to a fixed value such that its threshold voltage is greater than the threshold voltage of the transistor 3624.

Similarly, the backup bit line select unit 364 includes a global bit line 314, a BLT control line 246, a BLT control line 248, a transistor 3642, a transistor 3644 and fixed value memory cells 3645 to 3648. Each of the transistor 3642, the fixed value memory cell 3647 and the fixed value memory cell 3645 has a gate extended from the BLT control line 348, and the transistor 3642 does not has the data storage layer of the fixed value memory cell 3645. Each of the transistor 3644, the fixed value memory cell 3646 and the fixed value memory cell 3648 has a gate extended from the BLT control line 346, and the transistor 3644 does not has the data storage layer of the fixed value memory cell 3646. The transistor 3642 is coupled to the global bit line 314, the local bit line 224 and the BLT control line 348 and may be controlled by the BLT control line 348 to selectively turn on to connect the global bit line 314 to the local bit line 224. The transistor 3644 is coupled to the global bit line 314, the local bit line 228 and the BLT control line 346 and may be controlled by the BLT control line 346 to selectively turn on to connect the global bit line 314 to the local bit line 228.

The fixed value memory cell 3645 is coupled to the global bit line 314, the local bit line 228 and the BLT control line 348 and programmed to a fixed value such that its threshold voltage is greater than the threshold voltage of the transistor 3642. The fixed value memory cell 3646 is coupled to the global bit line 314, the local bit line 224 and the BLT control line 346 and programmed to a fixed value such that its threshold voltage is greater than the threshold voltage of the transistor 3644. The fixed value memory cell 3647 is coupled to local bit line 224, the local bit line 228 and the BLT control line 348 and programmed to a fixed value such that its threshold voltage is greater than the threshold voltage of the transistor 3642. The fixed value memory cell 3648 is coupled to the local bit line 228, the local bit line 224 and the BLT control line 346 and programmed to a fixed value such that its threshold voltage is greater than the threshold voltage of the transistor 3644.

Third Embodiment

Figure 5:
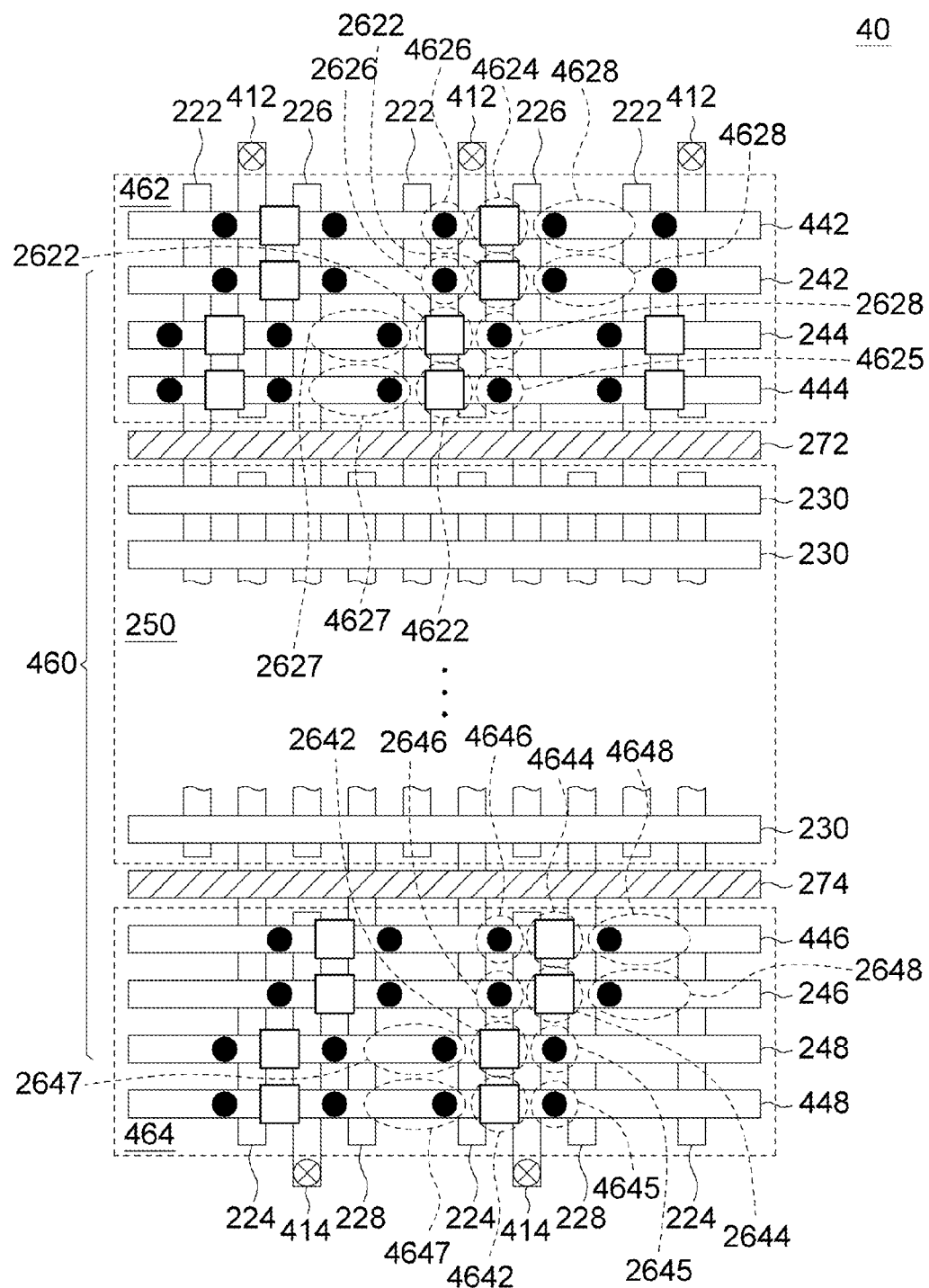
FIG. 5 is a schematic illustration showing a partial circuit layout of a memory cell array according to a third embodiment of the invention.
Figure 6:
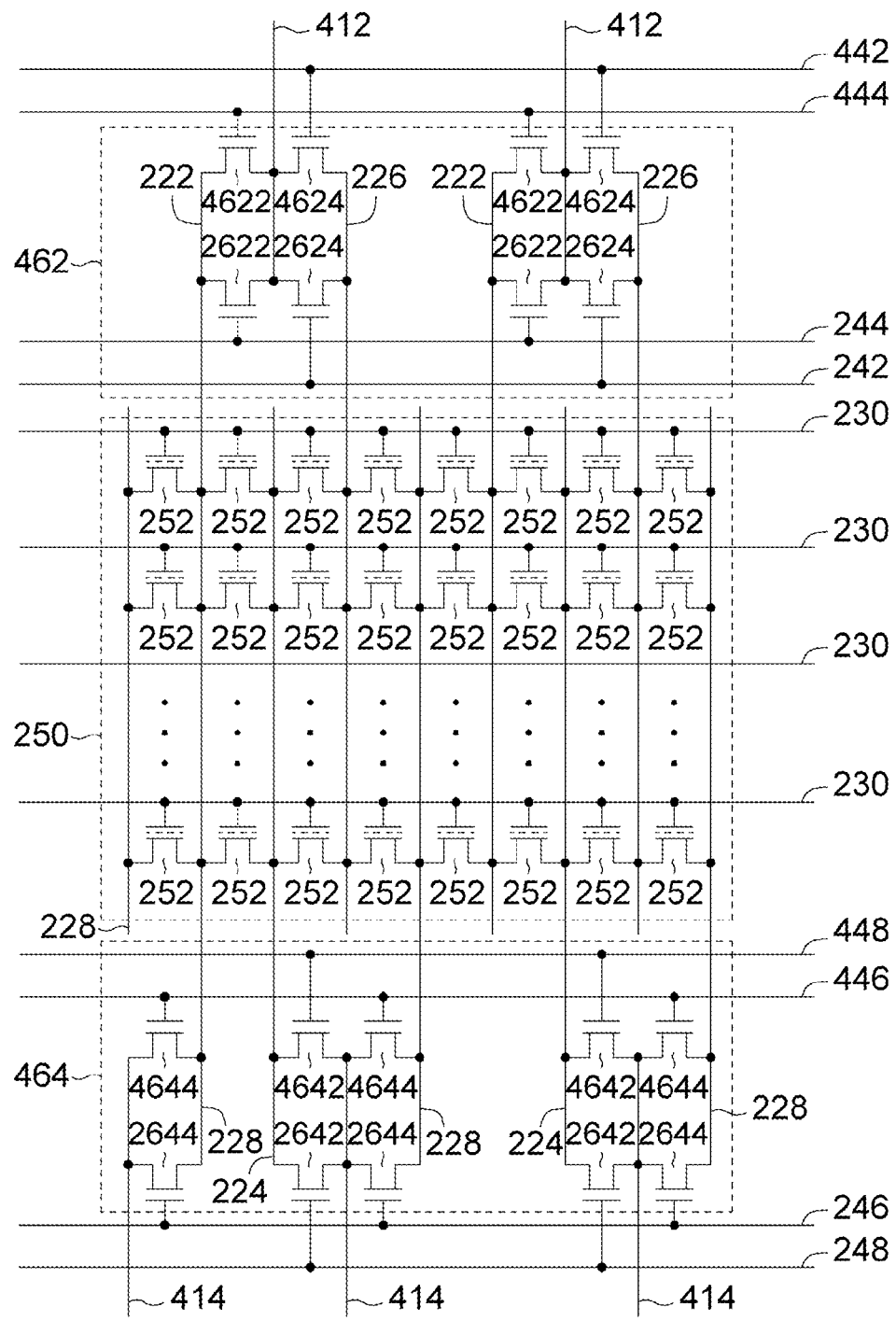
FIG. 6 is an equivalent circuit diagram showing a portion of the memory cell array according to the third embodiment of the invention.

FIG. 5 is a schematic illustration showing a partial circuit layout of a memory cell array 40 according to a third embodiment of the invention. FIG. 6 is an equivalent circuit diagram showing a portion of the memory cell array according to the third embodiment of the invention. As shown in FIGS. 5 and 6, the difference between the memory cell array 40 and the memory cell array 20 resides in that the select unit 460 is different from the select unit 260. The select unit 460 includes a bit line select unit 462 and a bit line select unit 464. The local bit line 222 and the local bit line 226 extend from the main memory cell array 250 to the bit line select unit 462, while the local bit line 224 and the local bit line 228 extend from the main memory cell array 250 to the bit line select unit 464.

In addition to the BLT control line 242, the BLT control line 244, the transistor 2622, the transistor 2624 and the fixed value memory cells 2625 to 2628, the bit line select unit 462 further includes a global bit line 442, a global bit line 444, a transistor 4622, a transistor 4624 and fixed value memory cells 4625 to 4628. In addition to the BLT control line 246, the BLT control line 248, the transistor 2642, the transistor 2644 and the fixed value memory cells 2645 to 2648, the bit line select unit 464 further includes a global bit line 446, a global bit line 448, a transistor 4642, a transistor 4644 and fixed value memory cells 4645 to 4648.

Each of the transistor 4622, the fixed value memory cell 4627 and the fixed value memory cell 4625 has a gate extended from the BLT control line 444, and the transistor 4622 does not has the data storage layer of the fixed value memory cell 4625. Each of the transistor 4624, the fixed value memory cell 4626 and the fixed value memory cell 4628 has a gate extended from the BLT control line 442, and the transistor 4624 does not has the data storage layer of the fixed value memory cell 4626. The transistor 4622 is coupled to the global bit line 412, the local bit line 222 and the BLT control line 444 and may be controlled by the BLT control line 444 to selectively turn on to connect the global bit line 412 to the local bit line 222. The transistor 4624 is coupled to the global bit line 412, the local bit line 226 and the BLT control line 442 and may be controlled by the BLT control line 442 to selectively turn on to connect the global bit line 412 to the local bit line 226.

The fixed value memory cell 4625 is coupled to the global bit line 412, the local bit line 226 and the BLT control line 444 and programmed to a fixed value such that its threshold voltage is greater than the threshold voltage of the transistor 4622. The fixed value memory cell 4626 is coupled to the global bit line 412, the local bit line 222 and the BLT control line 442 and programmed to a fixed value such that its threshold voltage is greater than the threshold voltage of the transistor 4624. The fixed value memory cell 4627 is coupled to the local bit line 222, the local bit line 226 and the BLT control line 244 and programmed to a fixed value such that its threshold voltage is greater than the threshold voltage of the transistor 4622. The fixed value memory cell 4628 is coupled to the local bit line 226, the local bit line 222 and the BLT control line 242 and programmed to a fixed value such that its threshold voltage is greater than the threshold voltage of the transistor 4624.

Similarly, each of the transistor 4642, the fixed value memory cell 4647 and the fixed value memory cell 4645 has a gate extended from the BLT control line 448, and the transistor 4642 does not has the data storage layer of the fixed value memory cell 4645. Each of the transistor 4644, the fixed value memory cell 4646 and the fixed value memory cell 4648 has a gate extended from the BLT control line 446, and the transistor 4644 does not has the data storage layer of the fixed value memory cell 4646. The transistor 4642 is coupled to the global bit line 414, the local bit line 224 and the BLT control line 448 and may be controlled by the BLT control line 448 to selectively turn on to connect the global bit line 414 to the local bit line 224. The transistor 4644 is coupled to the global bit line 414, the local bit line 228 and the BLT control line 446 and may be controlled by the BLT control line 246 to selectively turn on to connect the global bit line 414 to the local bit line 228.

The fixed value memory cell 4645 is coupled to the global bit line 412, the local bit line 228 and the BLT control line 448 and programmed to a fixed value such that its threshold voltage is greater than the threshold voltage of the transistor 4642. The fixed value memory cell 4646 is coupled to the global bit line 412, the local bit line 224 and the BLT control line 446 and programmed to a fixed value such that its threshold voltage is greater than the threshold voltage of the transistor 4644. The fixed value memory cell 4647 is coupled to the local bit line 224, the local bit line 228 and the BLT control line 448 and programmed to a fixed value such that its threshold voltage is greater than the threshold voltage of the transistor 4642. The fixed value memory cell 4648 is coupled to the local bit line 228, the local bit line 224 and the BLT control line 446 and programmed to a fixed value such that its threshold voltage is greater than the threshold voltage of the transistor 4644.

In other words, two array cells defined by the local bit lines 222, the local bit lines 226 and the BLT control lines 444 and 244, which are interlaced with each other, and two array cells defined by the global bit lines 412, the local bit lines 226, the BLT control line 444 and the BLT control line 244, which are interlaced with one another, are programmed. In addition, the data storage layers of the two array cells defined by the global bit lines 212, the local bit lines 222 and the BLT control lines 444 and 244, which are interlaced with one another, are removed to form the bit line transistors 2622 and 4622. The bit line transistors 2622 and 4622 are connected in parallel to increase the channel width. Two array cells defined by the local bit lines 222, the local bit lines 226, the BLT control line 442 and the BLT control line 242, which are interlaced with one another, and two array cells defined by the global bit lines 212, the local bit lines 226, the BLT control line 442 and the BLT control lines 242, which are interlaced with one another, are programmed. In addition, the data storage layers of the two array cells defined by the global bit lines 212, the local bit lines 226, the BLT control line 442 and the BLT control line 242, which are interlaced with one another, are removed to form bit line transistors 2624 and 4624. The two bit line transistors 2624 and 4624 are connected in parallel to increase the channel width.

Similarly, two array cells defined by the local bit lines 224, the local bit lines 228 and the BLT control lines 448 and 248, which are interlaced with one another, and two array cells defined by the global bit lines 414, the local bit lines 228 and the BLT control lines 448 and 248, which are interlaced with one another, are programmed. In addition, the data storage layers of the two array cells defined by the global bit lines 214, the local bit lines 224 and the two BLT control lines 248, which are interlaced with one another, are removed to form bit line transistors 2642 and 4642. The bit line transistors 2642 and 4642 are connected in parallel to increase the channel width. Two array cells defined by the local bit lines 224, the local bit lines 228 and the BLT control lines 446 and 246, which are interlaced with one another, and two array cells defined by the global bit lines 214, the local bit lines 224 and the BLT control lines 446 and 246, which are interlaced with one another, are programmed. In addition, the data storage layers of the two array cells defined by the global bit lines 214, the local bit lines 228 and the BLT control lines 446 and 246, which are interlaced with one another, are removed to form bit line transistors 2644 and 4644. The bit line transistors 2644 and 4644 are connected in parallel to increase the channel width.

Fourth Embodiment

Figure 7:
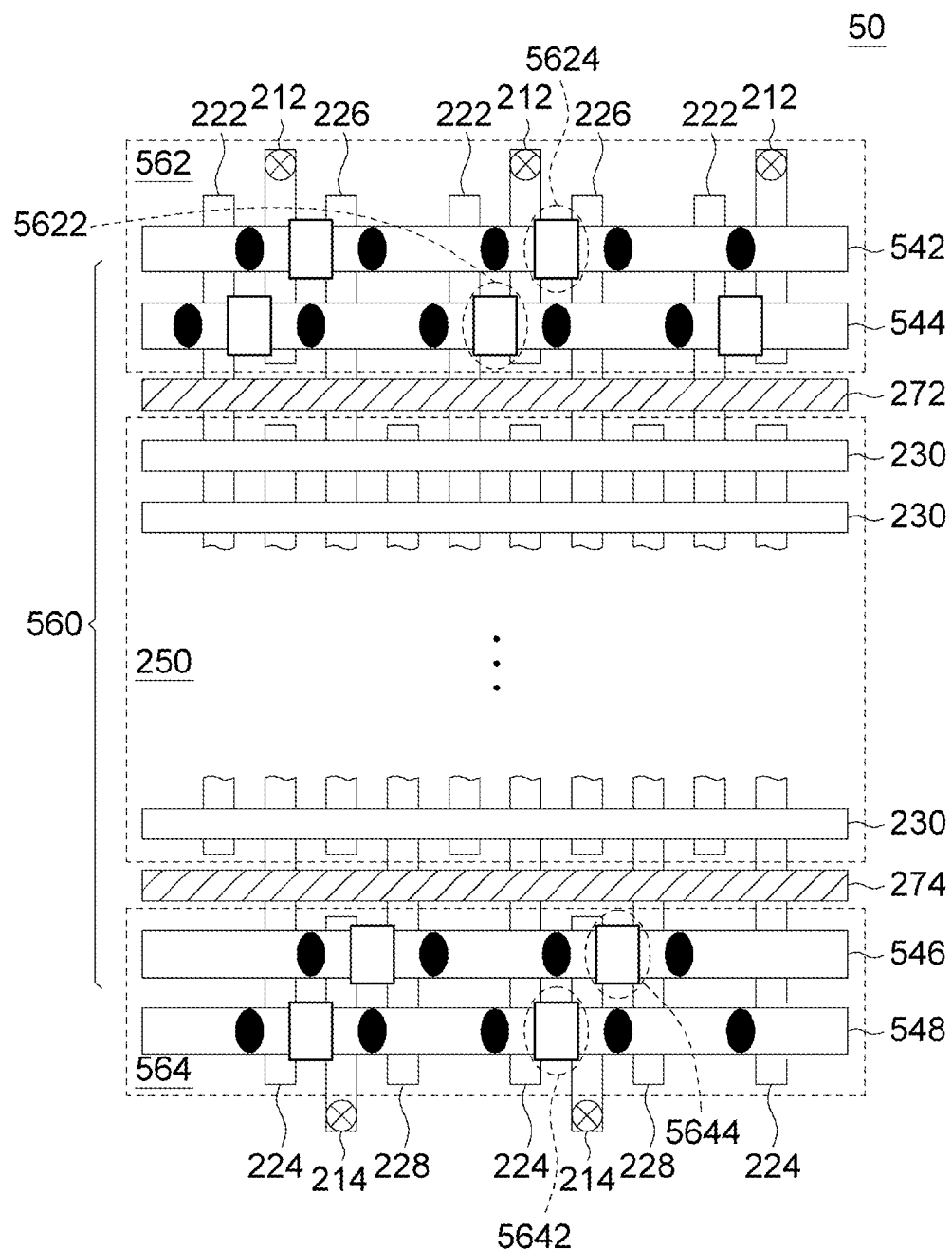
FIG. 7 is a schematic illustration showing a circuit layout of a memory cell array according to a fourth embodiment of the invention.

FIG. 7 is a schematic illustration showing a circuit layout of a memory cell array 50 according to a fourth embodiment of the invention. In the third embodiment, several bit line transistors are connected in parallel to increase the channel width. In the fourth embodiment, however, the width of the BLT control line is increased to increase the channel width. The difference between the memory cell array 50 and the memory cell array 20 resides in that the select unit 560 is different from the select unit 260. The select unit 560 includes a bit line select unit 562 and a bit line select unit 564. The widths of a BLT control line 542 and a BLT control line 544 of a bit line select unit 562 are greater than the width of the word line 230. In addition, the width of a BLT control line 546 and a BLT control line 548 of a bit line select unit 564 are greater than the width of the word line 230. The bit line select unit 562 and the bit line select unit 564 increase the channel width of the bit line transistor by increasing the widths of the BLT control line 542, the BLT control line 544, the BLT control line 546 and the BLT control line 548. So, the channel widths of the BLT 5622, BLT 5624, BLT 5626 and BLT 5628 of the fourth embodiment are greater than the channel widths of the BLT 2622, BLT 2624, BLT 2626 and BLT 2628 of the second embodiment.

Fifth Embodiment

Figure 8:
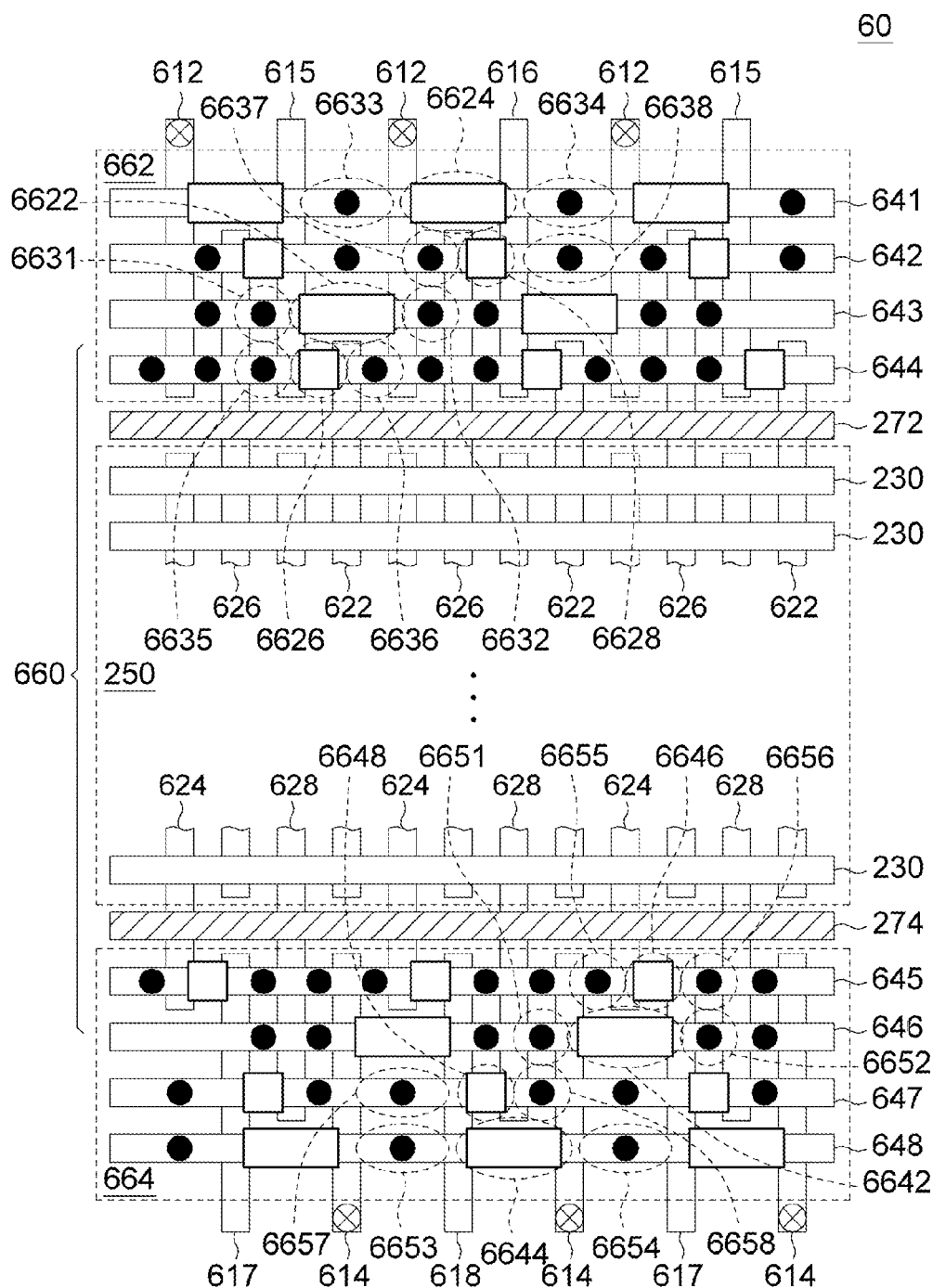
FIG. 8 is a schematic illustration showing a partial circuit layout of a memory cell array according to a fifth embodiment of the invention.
Figure 9:
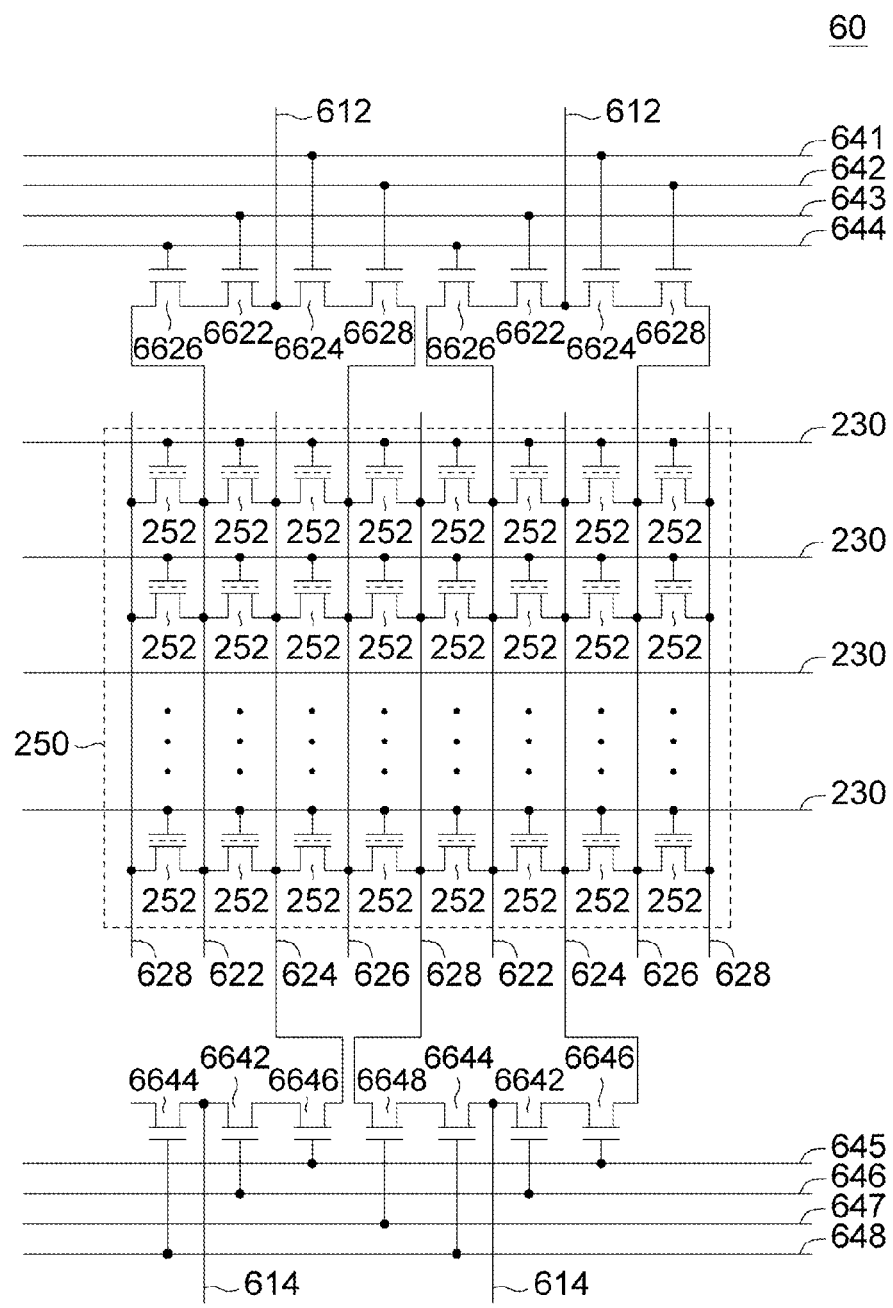
FIG. 9 is an equivalent circuit diagram showing the memory cell array according to the fifth embodiment of the invention.

FIG. 8 is a schematic illustration showing a partial circuit layout of a memory cell array 60 according to a fifth embodiment of the invention. FIG. 9 is an equivalent circuit diagram showing the memory cell array according to the fifth embodiment of the invention. In the third embodiment, several bit line transistors are connected in parallel to increase the channel width. In the fifth embodiment, however, several bit line transistors are connected in series to increase the channel length. The difference between the memory cell array 60 and the memory cell array 20 resides in that the select unit 560 is different from the select unit 260. The select unit 560 includes a bit line select unit 562 and a bit line select unit 564. The local bit line 622 and the local bit line 626 extend from the main memory cell array 250 to the bit line select unit 562, while the local bit line 624 and the local bit line 628 extend from the main memory cell array 250 to the bit line select unit 564.

The bit line select unit 662 includes a global bit line 612, a virtual global bit line 615, a virtual global bit line 616, BLT control lines 641 to 644, a transistor 6622, a transistor 6624, a transistor 6626, a transistor 6628 and fixed value memory cells 6631 to 638, while the bit line select unit 664 includes a global bit line 614, a virtual global bit line 617, a virtual global bit line 618, BLT control lines 645 to 648, a transistor 6642, a transistor 6644, a transistor 6646, a transistor 6648 and fixed value memory cells 2651 to 2658. The BLT control lines 641 to 644 are disposed on one side of the main memory cell array 250, and the BLT control lines 645 to 648 are disposed on another side of the main memory cell array 250. The BLT control lines 641 to 644 are disposed on one side of the main memory cell array 250, and the BLT control lines 645 to 648 are disposed on another side of the main memory cell array 250.

Local bit lines 622 respectively face global bit lines 614 and are interlaced with the BLT control line 644, the virtual word line 272 and the word lines 230, but are not interlaced with the BLT control line 641, the BLT control line 642 and the BLT control line 643. Local bit lines 624 respectively face global bit lines 612 and are interlaced with the BLT control line 645, the virtual word line 274 and the word lines 230, but are not interlaced with the BLT control line 646, the BLT control line 647 and the BLT control line 648.

Local bit lines 626 respectively face the virtual global bit lines 618 and are interlaced with the BLT control line 642, the BLT control line 643, the BLT control line 644, the virtual word line 274 and the word lines 230, but are not interlaced with the BLT control line 641. Local bit lines 628 respectively face the virtual global bit lines 616 and are interlaced with the BLT control line 645, the BLT control line 646, the BLT control line 647, the virtual word line 274 and the word line 230, but are not interlaced with the BLT control line 648.

Each of the transistor 6622, the fixed value memory cell 6631 and the fixed value memory cell 6632 has a gate extended from the BLT control line 643, and the transistor 6622 does not has the data storage layer of the fixed value memory cell 6631. The transistor 6622 is coupled to the global bit line 612, the virtual global bit line 615 and the BLT control line 643 and may be controlled by the BLT control line 643 to selectively turn on to connect the global bit line 612 to the virtual global bit line 615.

Each of the transistor 6626, the fixed value memory cell 6635 and the fixed value memory cell 6636 has a gate extended from the BLT control line 644, and the transistor 6626 does not has the data storage layer of the fixed value memory cell 6635. The transistor 6626 is coupled to the virtual global bit line 615, the local bit line 622 and the BLT control line 644 and may be controlled by8 the BLT control line 644 to selectively turn on to connect the virtual global bit line 615 to the local bit line 622. The global bit line 612 may be coupled to local bit line 622 through the transistor 6622 and the transistor 6626.

Each of the transistor 6624, the fixed value memory cell 6633 and the fixed value memory cell 6634 has a gate extended from the BLT control line 641, and the transistor 6624 does not has the data storage layer of the fixed value memory cell 6633. The transistor 6624 is coupled to the global bit line 612, the virtual global bit line 616 and the BLT control line 641 and may be controlled by the BLT control line 641 to selectively turn on to connect the global bit line 612 to the virtual global bit line 616.

Each of the transistor 6628, the fixed value memory cell 6637 and the fixed value memory cell 6638 has a gate extended from the BLT control line 642, and the transistor 6628 does not has the data storage layer of the fixed value memory cell 6637. The transistor 6628 is coupled to the virtual global bit line 616, the local bit line 626 and the BLT control line 642 and may be controlled by the BLT control line 642 to selectively turn on to connect the virtual global bit line 616 to the local bit line 626. The global bit line 612 may be coupled to the local bit line 626 through the transistor 6624 and the transistor 6628.

The fixed value memory cell 6631 is coupled to the virtual global bit line 615, the local bit line 626 and the BLT control line 643, while the fixed value memory cell 6632 is coupled to the global bit line 612, the local bit line 626 and the BLT control line 643. Each of the fixed value memory cell 6631 and the fixed value memory cell 6632 is programmed to a fixed value such that its threshold voltage is greater than the threshold voltage of the transistor 6622.

The fixed value memory cell 6633 is coupled to the virtual global bit line 615, the global bit line 612 and the BLT control line 641, while the fixed value memory cell 6634 is coupled to the global bit line 612, the virtual global bit line 616 and the BLT control line 641. Each of the fixed value memory cell 6633 and the fixed value memory cell 6634 is programmed to a fixed value such that its threshold voltage is greater than the threshold voltage of the transistor 6624.

The fixed value memory cell 6635 is coupled to the virtual global bit line 615, the local bit line 626 and the BLT control line 644, while the fixed value memory cell 6636 is coupled to the global bit line 612, the local bit line 622 and the BLT control line 644. Each of the fixed value memory cell 6635 and the fixed value memory cell 6636 is programmed to a fixed value such that its threshold voltage is greater than the threshold voltage of the transistor 6626.

The fixed value memory cell 6637 is coupled to the global bit line 612, the local bit line 626 and the BLT control line 642, while the fixed value memory cell 6638 is coupled to the global bit line 612, the virtual global bit line 616 and the BLT control line 642. Each of the fixed value memory cell 6637 and the fixed value memory cell 6638 is programmed to a fixed value such that its threshold voltage is greater than the threshold voltage of the transistor 6628.

Similarly, each of the transistor 6642, the fixed value memory cell 6651 and the fixed value memory cell 6652 has a gate extended from the BLT control line 646, and the transistor 6642 does not has the data storage layer of the fixed value memory cell 6651. The transistor 6642 is coupled to the global bit line 614, the virtual global bit line 617 and the BLT control line 646 and may be controlled by the BLT control line 646 to selectively turn on to connect the global bit line 614 to the virtual global bit line 617.

Each of the transistor 6646, the fixed value memory cell 6655 and the fixed value memory cell 6656 has a gate extended from the BLT control line 645, and the transistor 6646 does not has the data storage layer of the fixed value memory cell 6655. The transistor 6646 is coupled to the virtual global bit line 617, the local bit line 624 and the BLT control line 645 and may be controlled by the BLT control line 645 to selectively turn on to connect the virtual global bit line 617 to the local bit line 624. The global bit line 614 may be coupled to the local bit line 624 through the transistor 6642 and the transistor 6646.

Each of the transistor 6644, the fixed value memory cell 6653 and the fixed value memory cell 6654 has a gate extended from the BLT control line 648, and the transistor 6644 does not has the data storage layer of the fixed value memory cell 6653. The transistor 6644 is coupled to the global bit line 614, the virtual global bit line 618 and the BLT control line 648 and may be controlled by the BLT control line 648 to selectively turn on to connect the global bit line 614 to the virtual global bit line 618.

Each of the transistor 6648, the fixed value memory cell 6657 and the fixed value memory cell 6658 has a gate extended from the BLT control line 647, and the transistor 6648 does not has the data storage layer of the fixed value memory cell 6657. The transistor 6648 is coupled to the virtual global bit line 618, the local bit line 628 and the BLT control line 647 and may be controlled by the BLT control line 647 to selectively turn on to connect the virtual global bit line 618 to the local bit line 628. The global bit line 614 may be coupled to the local bit line 628 through the transistor 6644 and the transistor 6648.

The fixed value memory cell 6652 is coupled to the virtual global bit line 617, the local bit line 628 and the BLT control line 645, while the fixed value memory cell 6651 is coupled to the global bit line 614, the local bit line 628 and the BLT control line 646. Each of the fixed value memory cell 6651 and the fixed value memory cell 6652 is programmed to a fixed value such that its threshold voltage is greater than the threshold voltage of the transistor 6642.

The fixed value memory cell 6653 is coupled to the virtual global bit line 618, the global bit line 614 and the BLT control line 648, while the fixed value memory cell 6654 is coupled to the global bit line 614, the virtual global bit line 617 and the BLT control line 648. Each of the fixed value memory cell 6653 and the fixed value memory cell 6654 is programmed to a fixed value such that its threshold voltage is greater than the threshold voltage of the transistor 6644.

The fixed value memory cell 6656 is coupled to the virtual global bit line 617, the local bit line 628 and the BLT control line 645, while the fixed value memory cell 6655 is coupled to the global bit line 614, the local bit line 624 and the BLT control line 645. Each of the fixed value memory cell 6655 and the fixed value memory cell 6656 is programmed to a fixed value such that its threshold voltage is greater than the threshold voltage of the transistor 6646.

The fixed value memory cell 6658 is coupled to the global bit line 614, the local bit line 628 and the BLT control line 647, while the fixed value memory cell 6657 is coupled to the global bit line 614, the virtual global bit line 618 and the BLT control line 647. Each of the fixed value memory cell 6657 and the fixed value memory cell 6658 is programmed to a fixed value such that its threshold voltage is greater than the threshold voltage of the transistor 6648.

In other words, the array cells defined by the local bit lines 626, the virtual global bit lines 615 and the BLT control line 643, which are interlaced with one another, and the array cells defined by the local bit lines 626, the global bit lines 612 and the BLT control line 643, which are interlaced with one another, are programmed. In addition, the data storage layers of the array cells defined by the global bit lines 612, the virtual global bit lines 615 and the BLT control line 643, which are interlaced with one another, are removed to form bit line transistors 6622. The array cells defined by the local bit lines 626, the virtual global bit lines 615 and the BLT control line 644, which are interlaced with one another, and the array cells the local bit lines 622, the global bit lines 612 and the BLT control line 644, which are interlaced with one another, are programmed. In addition, the data storage layers of the array cells defined by the local bit lines 622, the virtual global bit lines 615 and the BLT control line 644, which are interlaced with one another, are removed to form bit line transistors 6626. The bit line transistors 6626 and the bit line transistors 6622 are connected in series to increase the channel length.

The array cells defined by the global bit lines 612, the virtual global bit lines 615 and the BLT control line 641, which are interlaced with one another, and the array cells defined by the global bit lines 612, the virtual global bit lines 616 and the BLT control line 641, which are interlaced with one another, are programmed. In addition, the data storage layers of the array cells defined by the global bit lines 612, the virtual global bit lines 616 and the BLT control line 641, which are interlaced with one another, are removed to form bit line transistors 6624. The array cells defined by the local bit lines 626, the global bit lines 612 and the BLT control line 642, which are interlaced with one another, and the array cells defined by the virtual global bit lines 616, the global bit lines 612 and the BLT control line 642, which are interlaced with one another, are programmed. In addition, the data storage layers of the array cells defined by the local bit lines 626, the virtual global bit lines 616 and the BLT control line 642, which are interlaced with one another, are removed to form bit line transistors 6628. The bit line transistors 6624 and the bit line transistors 6628 are connected in series to increase the channel length.

A portion of the array cells defined by the global bit lines 614, the virtual global bit lines 618 and the BLT control line 648, which are interlaced with one another, and a portion of the array cells defined by the global bit lines 614, the virtual global bit lines 617 and the BLT control line 648, which are interlaced with one another, are programmed. In addition, the data storage layers of the array cells defined by the global bit lines 614, the virtual global bit lines 618 and the BLT control line 648, which are interlaced with one another, are removed to form bit line transistors 6644. The array cells defined by the local bit lines 628, the global bit lines 614 and the BLT control line 647, which are interlaced with one another, and the array cells defined by the virtual global bit lines 618, the global bit lines 614 and the BLT control line 647, which are interlaced with one another, are programmed. In addition, the data storage layers of the array cells defined by the local bit lines 628, the virtual global bit lines 618 and the BLT control line 647, which are interlaced with one another, are removed to form bit line transistors 6648. The bit line transistors 6644 and the bit line transistors 6648 are connected in series to increase the channel length.

The array cells defined by the local bit lines 628, the virtual global bit lines 617 and the BLT control line 646, which are interlaced with one another, and the array cells defined by the local bit lines 628, the global bit lines 614 and the BLT control line 646, which are interlaced with one another, are programmed. In addition, the data storage layers of the array cells defined by the global bit lines 614, the virtual global bit lines 617 and the BLT control line 646, which are interlaced with one another, are removed to form bit line transistors 6642. The array cells defined by the local bit lines 628, the virtual global bit lines 617 and the BLT control line 645, which are interlaced with one another, and the array cells defined by the local bit lines 624, the global bit lines 614 and the BLT control line 645, which are interlaced with one another, are programmed. In addition, the data storage layers of the array cells defined by the local bit lines 624, the virtual global bit lines 617 and the BLT control line 645, which are interlaced with one another, are removed to form bit line transistors 6646. The bit line transistors 6642 and the bit line transistors 6646 are connected in series to increase the channel length.

Sixth Embodiment

Figure 10:
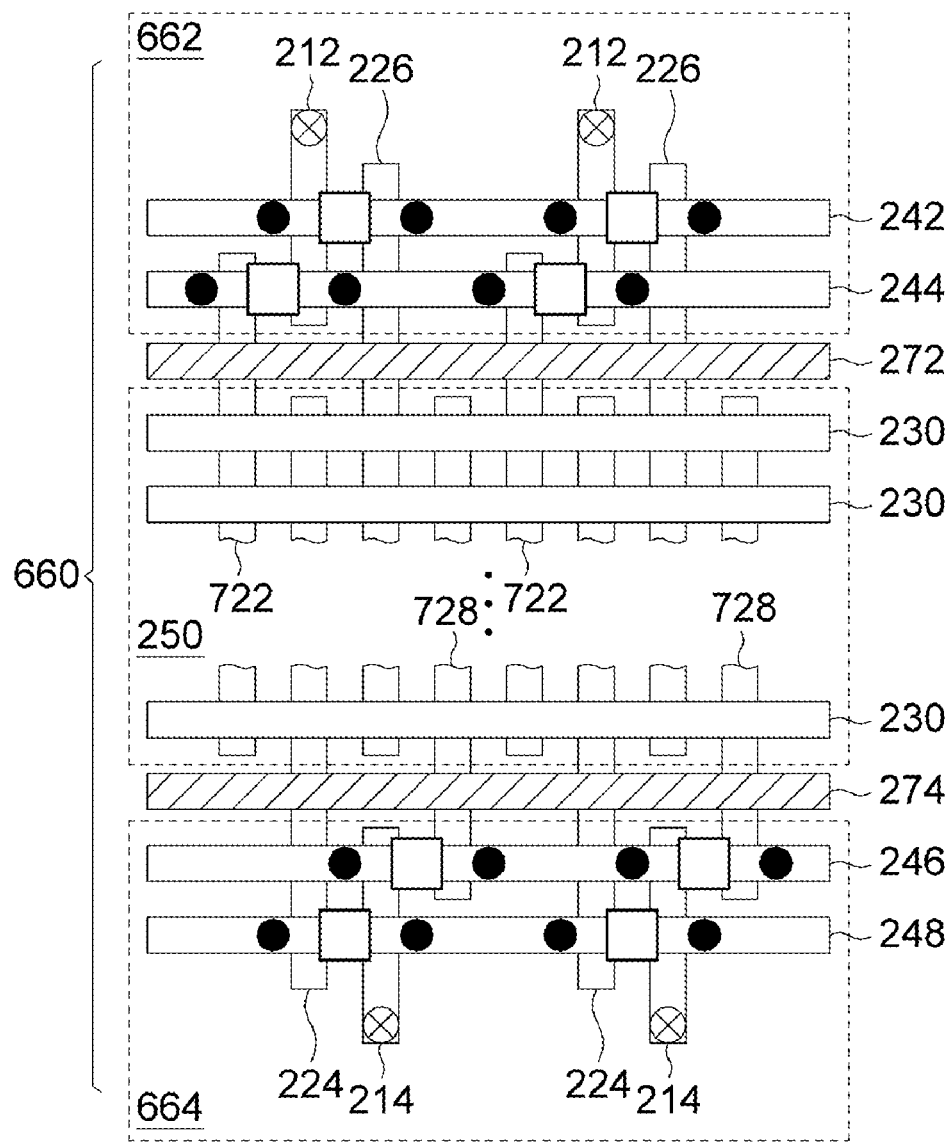
FIG. 10 is a schematic illustration showing a partial circuit layout of a memory cell array according to a sixth embodiment of the invention.

FIG. 10 is a schematic illustration showing a partial circuit layout of a memory cell array 70 according to a sixth embodiment of the invention. As shown in FIG. 10, the difference between the memory cell array 70 and the memory cell array 20 resides in that the select unit 660 is different from the select unit 260. The select unit 660 includes a bit line select unit 662 and a bit line select unit 664. The local bit line 722 and the local bit line 226 extend from the main memory cell array 250 to the bit line select unit 662, while the local bit line 224 and the local bit line 728 extend from the main memory cell array 250 to the bit line select unit 664.

The local bit lines 722 are interlaced with the BLT control line 244, the virtual word line 272 and the word lines 230, but are not interlaced with the BLT control line 242, and that local bit lines 728 are interlaced with the BLT control line 246, the virtual word line 274 and the word lines 230, but are not interlaced with the BLT control line 248.

Seventh Embodiment

Figure 11:
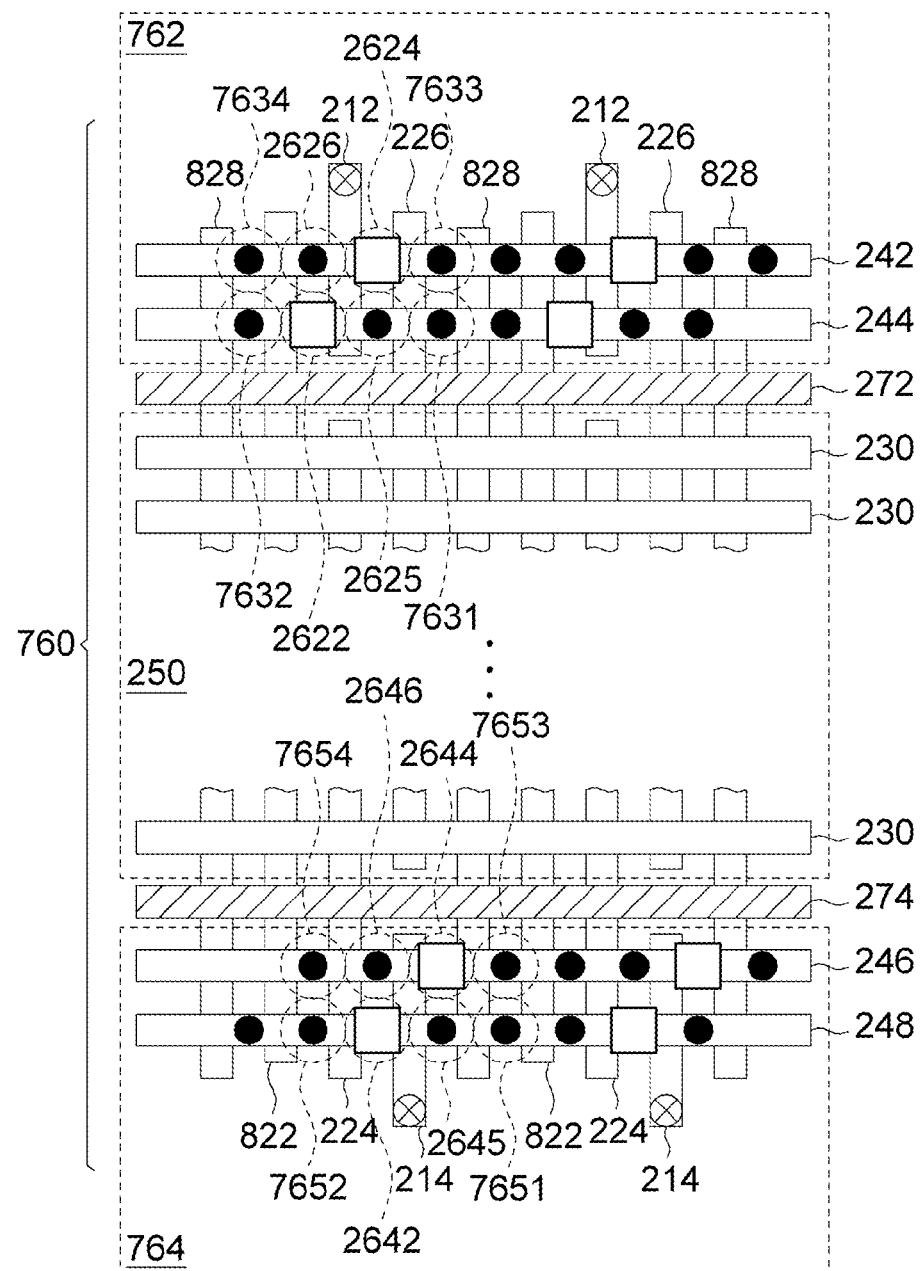
FIG. 11 is a schematic illustration showing a partial circuit layout of a memory cell array according to a seventh embodiment of the invention.

FIG. 11 is a schematic illustration showing a partial circuit layout of a memory cell array 80 according to a seventh embodiment of the invention. As shown in FIG. 11, the difference between the memory cell array 80 and the memory cell array 20 resides in that the select unit 760 is different from the select unit 260. The select unit 760 includes a bit line select unit 762 and a bit line select unit 764. The bit line select unit 762 includes a global bit line 212, a BLT control line 242, a BLT control line 244, a transistor 2622, a transistor 2624, fixed value memory cells 2625 to 2626 and fixed value memory cells 7631 to 7634. The bit line select unit 764 includes a global bit line 214, a BLT control line 246, a BLT control line 248, a transistor 2642, a transistor 2644, fixed value memory cells 2645 to 2646 and fixed value memory cells 7651 to 7654. The local bit line 822, the local bit line 828 and the local bit line 226 extend from the main memory cell array 250 to the bit line select unit 762, while the local bit line 822, the local bit line 828 and the local bit line 224 extend from the main memory cell array 250 to the bit line select unit 764.

The local bit lines 822 are interlaced with the BLT control line 242, the BLT control line 244, the virtual word line 272, the word lines 230, the virtual word line 274, the BLT control line 246 and the BLT control line 248, and that local bit lines 828 are interlaced with the BLT control line 242, the BLT control line 244, the virtual word line 272, the word lines 230, the virtual word line 274, the BLT control line 246 and the BLT control line 248.

Each of the transistor 2622, the fixed value memory cell 7631, the fixed value memory cell 7632 and the fixed value memory cell 2625 has a gate extended from the BLT control line 244, and the transistor 2622 does not has the data storage layer of the fixed value memory cell 2625. The fixed value memory cell 2625 is coupled to the global bit line 212, the local bit line 226 and the BLT control line 244 and programmed to a fixed value such that its threshold voltage is greater than the threshold voltage of the transistor 2622. The fixed value memory cell 7631 is coupled to the local bit line 828, the local bit line 226 and the BLT control line 244 and programmed to a fixed value such that its threshold voltage is greater than the threshold voltage of the transistor 2622. The fixed value memory cell 7632 is coupled to the local bit line 828, the local bit line 822 and the BLT control line 244 and programmed to a fixed value such that its threshold voltage is greater than the threshold voltage of the transistor 2622.

Each of the transistor 2624, the fixed value memory cell 7633, the fixed value memory cell 7634 and the fixed value memory cell 2626 has a gate extended from the BLT control line 242, and the transistor 2624 does not has the data storage layer of the fixed value memory cell 2626. The fixed value memory cell 2626 is coupled to the global bit line 212, the local bit line 822 and the BLT control line 242 and programmed to a fixed value such that its threshold voltage is greater than the threshold voltage of the transistor 2624. The fixed value memory cell 7633 is coupled to the local bit line 828, the local bit line 226 and the BLT control line 242 and programmed to a fixed value such that its threshold voltage is greater than the threshold voltage of the transistor 2624. The fixed value memory cell 7634 is coupled to the local bit line 828, the local bit line 822 and the BLT control line 242 and programmed to a fixed value such that its threshold voltage is greater than the threshold voltage of the transistor 2624.

Each of the transistor 2642, the fixed value memory cell 7651, the fixed value memory cell 7652 and the fixed value memory cell 2645 has a gate extended from the BLT control line 248, and the transistor 2642 does not has the data storage layer of the fixed value memory cell 2645. The fixed value memory cell 2645 is coupled to the global bit line 214, the local bit line 828 and the BLT control line 248 and programmed to a fixed value such that its threshold voltage is greater than the threshold voltage of the transistor 2642. The fixed value memory cell 7651 is coupled to the local bit line 828, the local bit line 822 and the BLT control line 248 and programmed to a fixed value such that its threshold voltage is greater than the threshold voltage of the transistor 2642. The fixed value memory cell 7652 is coupled to the local bit line 224, the local bit line 822 and the BLT control line 248 and programmed to a fixed value such that its threshold voltage is greater than the threshold voltage of the transistor 2642.

Each of the transistor 2644, the fixed value memory cell 7653, the fixed value memory cell 7654 and the fixed value memory cell 2646 has a gate extended from the BLT control line 246, and the transistor 2644 does not has the data storage layer of the fixed value memory cell 2646. The fixed value memory cell 2646 is coupled to the global bit line 214, the local bit line 224 and the BLT control line 246 and programmed to a fixed value such that its threshold voltage is greater than the threshold voltage of the transistor 2644. The fixed value memory cell 7653 is coupled to the local bit line 828, the local bit line 822 and the BLT control line 246 and programmed to a fixed value such that its threshold voltage is greater than the threshold voltage of the transistor 2644. The fixed value memory cell 7654 is coupled to the local bit line 224, the local bit line 822 and the BLT control line 246 and programmed to a fixed value such that its threshold voltage is greater than the threshold voltage of the transistor 2644.

In other words, the array cells defined by the local bit lines 828, the local bit lines 226 and the BLT control line 242, which are interlaced with one another, and the array cells defined by the local bit lines 828, the local bit lines 822 and the BLT control line 242, which are interlaced with one another, are programmed. The array cells defined by the local bit lines 828, the local bit lines 226 and the BLT control line 244, which are interlaced with one another, and the array cells defined by the local bit lines 828, the local bit lines 822 and the BLT control line 244, which are interlaced with one another, are programmed.

Similarly, the local bit line 822 extends from the main memory cell array 250 to the bit line select unit 764 to form several memory cells together with the local bit line 828, the local bit line 224, the BLT control line 246 and the BLT control line 248. The array cells defined by the local bit lines 822, the local bit lines 828 and the BLT control line 246, which are interlaced with one another, and the array cells defined by the local bit lines 822, the local bit lines 224 and the BLT control lines 246, which are interlaced with one another, are programmed. The array cells defined by the local bit lines 822, the local bit lines 828 and the BLT control line 248, which are interlaced with one another, and the array cells defined by the local bit lines 822, the local bit lines 224 and the BLT control line 248, which are interlaced with one another, are programmed.

Eighth Embodiment

Figure 12:
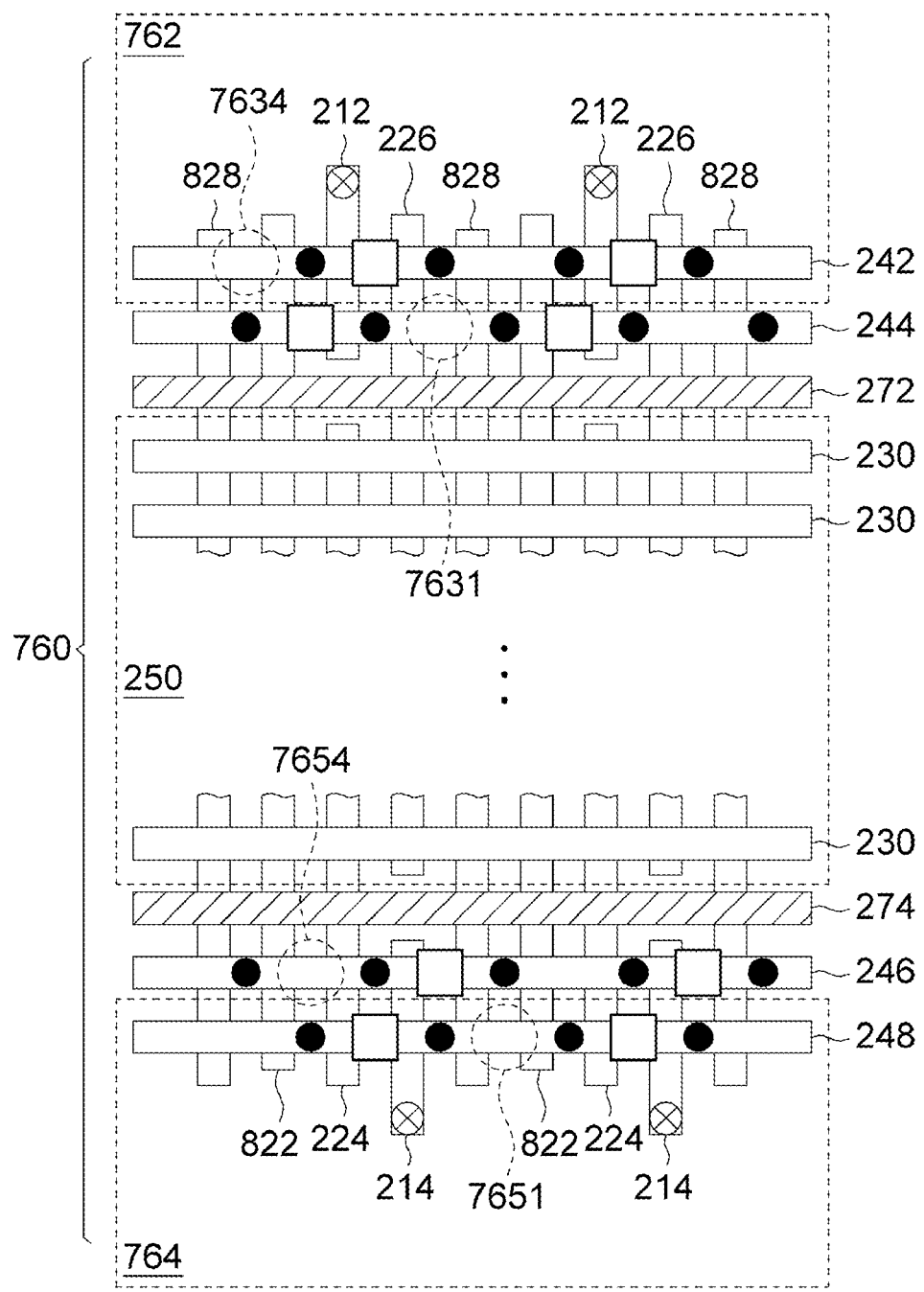
FIG. 12 is a schematic illustration showing a partial circuit layout of a memory cell array according to an eighth embodiment of the invention.

FIG. 12 is a schematic illustration showing a partial circuit layout of a memory cell array 90 according to an eighth embodiment of the invention. As shown in FIG. 12, the difference between the memory cell array 90 and the memory cell array 80 resides in that the fixed value memory cell 7631, the fixed value memory cell 7634, the fixed value memory cell 7651 and the fixed value memory cell 7654 are not programmed.

Ninth Embodiment

Figure 13:
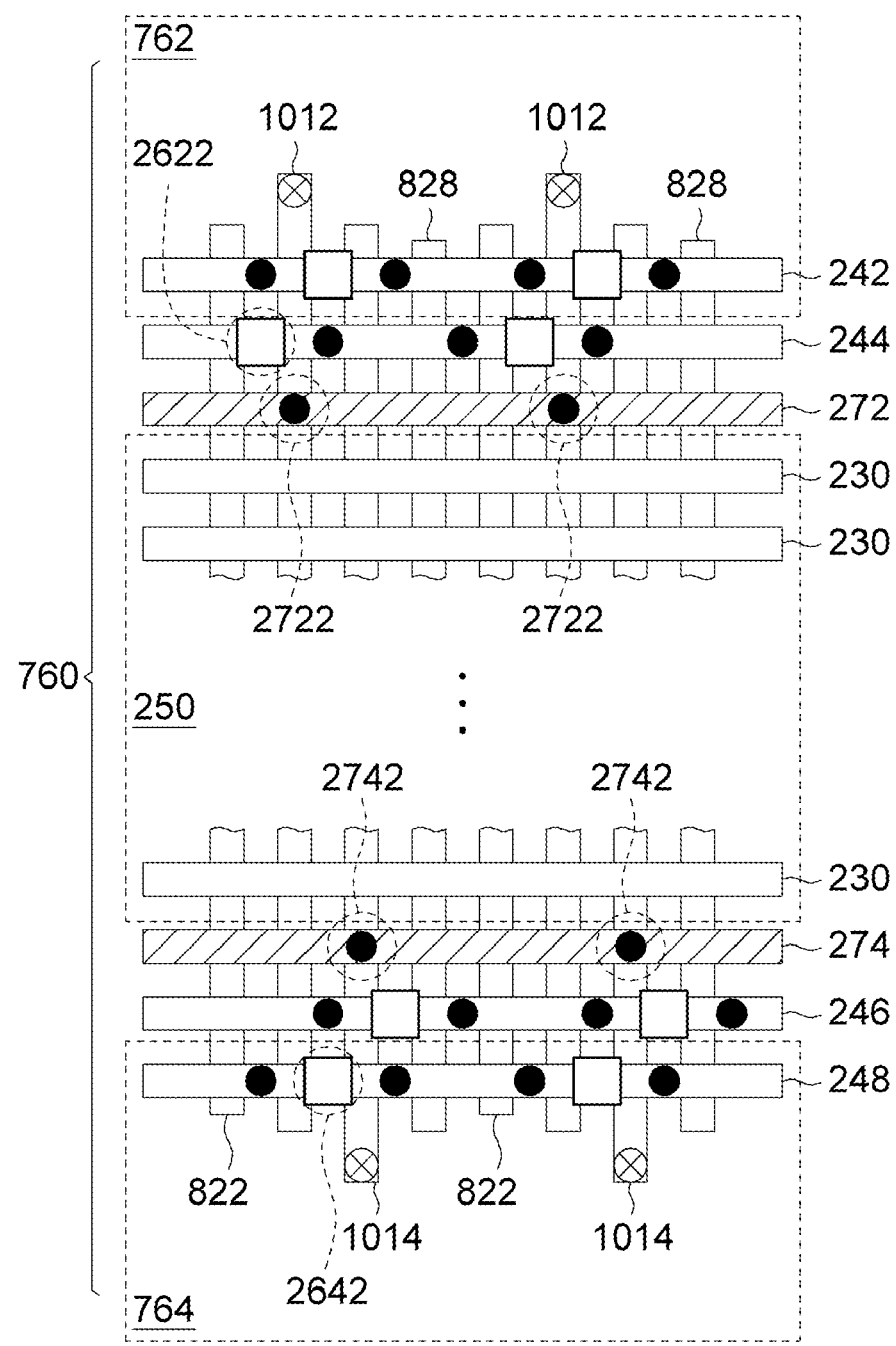
FIG. 13 is a schematic illustration showing a partial circuit layout of a memory cell array according to a ninth embodiment of the invention.

FIG. 13 is a schematic illustration showing a partial circuit layout of a memory cell array 100 according to a ninth embodiment of the invention. As shown in FIGS. 12 and 13, the difference between the memory cell array 100 and the memory cell array 90 resides in that the global bit line 1012 extends from the bit line select unit 762 to the main memory cell array 250 and the bit line select unit 764, and that the global bit line 1014 extends from the bit line select unit 764 to the main memory cell array 250 and the bit line select unit 762. The memory cell array 100 further includes a fixed value memory cell 2722 and a fixed value memory cell 2724. The fixed value memory cell 2722 is coupled to the global bit line 1012 and the virtual word line 272 interposed between the main memory cell array 250 and the bit line select unit 762 and programmed to a fixed value such that its threshold voltage is greater than the threshold voltage of the transistor 2622. The fixed value memory cell 2742 is coupled to the global bit line 1014 and the virtual word line 274 interposed between the main memory cell array 250 and the bit line select unit 764 and programmed to a fixed value such that its threshold voltage is greater than the threshold voltage of the transistor 2642.

In the memory cell array of the memory according to each embodiment of the invention, the array cell is adopted to replace the conventional MOS transistor to serve as the bit line transistor. In addition, the bit line select circuit is implemented by programming the array cells and removing the data storage layers of the array cells in the memory cell array of each embodiment. Consequently, the circuit layout area of the bit line transistors can be greatly reduced.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory cell array of a memory, comprising:
    a main memory cell array, comprising:
        a plurality of local bit lines comprising a first local bit line and a second local bit line;
        a plurality of word lines; and
        a plurality of memory cells, each of which corresponds to and is connected to one of the local bit lines and one of the word lines and, for storing data; and
    a selected array, comprising:
        at least one global bit line;
        at least one first bit line transistor (BLT) control line;
        at least one first transistor, which is coupled to the global bit line, the first local bit line and the first BLT control line and may be controlled by the first BLT control line to selectively turn on to connect the global bit line to the first local bit line; and
        at least one first fixed value memory cell, which is coupled to the global bit line, the second local bit line and the first BLT control line and programmed to a fixed value such that a threshold voltage of the first fixed value memory cell is greater than a threshold voltage of the first transistor.

2. The memory cell array according to claim 1, wherein the first fixed value memory cell has a layout structure comprising a data storage layer, and the first transistor has a layout structure similar to the layout structure of the first fixed value memory cell except for the data storage layer.

3. The memory cell array according to claim 1, wherein a virtual word line is interposed between the main memory cell array and the selected array.

4. The memory cell array according to claim 1, wherein the selected array further comprises:
    a second bit line transistor (BLT) control line;
    a second transistor, which is coupled to the global bit line, the second local bit line and the second BLT control line and may be controlled by the second BLT control line to selectively turn on to connect the global bit line to the second local bit line; and a second fixed value memory cell, which is coupled to the global bit line, the first local bit line and the second BLT control line and programmed to a fixed value such that a threshold voltage of the second fixed value memory cell is greater than a threshold voltage of the second transistor.

5. The memory cell array according to claim 4, wherein the second fixed value memory cell has a layout structure comprising a data storage layer, and the second transistor has a layout structure similar to the layout structure of the second fixed value memory cell except for the data storage layer.

6. The memory cell array according to claim 4, further comprising a backup selected array, which comprises:
 at least one third bit line transistor (BLT) control line;
 at least one third transistor, which is coupled to the global bit line, the first local bit line and the third BLT control line and may be controlled by the third BLT control line to selectively turn on to connect the global bit line to the first local bit line;
 at least one third fixed value memory cell, which is coupled to the global bit line, the second local bit line and the third BLT control line and programmed to a fixed value such that a threshold voltage of the third fixed value memory cell is greater than a threshold voltage of the third transistor;
 a fourth bit line transistor (BLT) control line;
 a fourth transistor, which is coupled to the global bit line, the second local bit line and the fourth BLT control line and may be controlled by the fourth BLT control line to selectively turn on to connect the global bit line to the second local bit line; and
 a fourth fixed value memory cell, which is coupled to the global bit line, the first local bit line and the fourth BLT control line and programmed to a fixed value such that a threshold voltage of the fourth fixed value memory cell is greater than a threshold voltage of the fourth transistor.

7. The memory cell array according to claim 4, wherein the third fixed value memory cell has a layout structure comprising a first data storage layer, the third transistor has a layout structure similar to the layout structure of the third fixed value memory cell except for the first data storage layer, the fourth fixed value memory cell has a layout structure comprising a second data storage layer, and the fourth transistor has a layout structure similar to the layout structure of the fourth fixed value memory cell except for the second data storage layer.

8. The memory cell array according to claim 4, wherein the selected array further comprising:
 at least one third bit line transistor (BLT) control line;
 at least one third transistor, which is coupled to the global bit line, the first local bit line and the third BLT control line and may be controlled by the third BLT control line to selectively turn on to connect the global bit line to the first local bit line;
 at least one third fixed value memory cell, which is coupled to the global bit line, the second local bit line and the third BLT control line and programmed to a fixed value such that a threshold voltage of the third fixed value memory cell is greater than a threshold voltage of the third transistor;
 a fourth bit line transistor (BLT) control line;
 a fourth transistor, which is coupled to the global bit line, the second local bit line and the fourth BLT control line and may be controlled by the fourth BLT control line to selectively turn on to connect the global bit line to the second local bit line; and
 a fourth fixed value memory cell, which is coupled to the global bit line, the first local bit line and the fourth BLT control line and programmed to a fixed value such that a threshold voltage of the fourth fixed value memory cell is greater than a threshold voltage of the fourth transistor.

9. The memory cell array according to claim 8, wherein the third fixed value memory cell has a layout structure comprising a first data storage layer, the third transistor has a layout structure similar to the layout structure of the third fixed value memory cell except for the first data storage layer, the fourth fixed value memory cell has a layout structure comprising a second data storage layer, and the fourth transistor has a layout structure similar to the layout structure of the fourth fixed value memory cell except for the second data storage layer.

10. The memory cell array according to claim 8, wherein the first BLT control line is disposed between the second BLT control line and the third BLT control line, and the second BLT control line is disposed between the first BLT control line and the fourth BLT control line.

11. The memory cell array according to claim 1, wherein a width of the first BLT control line is greater than a width of the word lines.

12. The memory cell array according to claim 4, further comprising:
 a first virtual global bit line;
 a third bit line transistor (BLT) control line;
 a third transistor, which is coupled to the first local bit line, the first virtual global bit line and the third BLT control line and may be controlled by the third BLT control line to selectively turn on to connect the first local bit line to the first virtual global bit line;
 a third fixed value memory cell, which is coupled to the global bit line, the first virtual global bit line and the third BLT control line and programmed to a fixed value such that a threshold voltage of the third fixed value memory cell is greater than a threshold voltage of the third transistor;
 a second virtual global bit line;
 a fourth bit line transistor (BLT) control line;
 a fourth transistor, which is coupled to the second local bit line, the second virtual global bit line and the fourth BLT control line and may be controlled by the fourth BLT control line to selectively turn on to connect the second local bit line to the second virtual global bit line; and
 a fourth fixed value memory cell, which is coupled to the global bit line, the second virtual global bit line and the fourth BLT control line and programmed to a fixed value such that a threshold voltage of the fourth fixed value memory cell is greater than a threshold voltage of the fourth transistor.

13. The memory cell array according to claim 12, wherein the third fixed value memory cell has a layout structure comprising a first data storage layer, the third transistor has a layout structure similar to the layout structure of the third fixed value memory cell except for the first data storage layer, the fourth fixed value memory cell has a layout structure similar to a layout structure of the second data storage layer, and the fourth transistor has a layout structure similar to the layout structure of the fourth fixed value memory cell except for the second data storage layer.

14. The memory cell array according to claim 12, wherein a channel length of the first transistor is greater than a channel length of the third transistor, and a channel length of the second transistor is greater than a channel length of the fourth transistor.

15. The memory cell array according to claim 12, wherein the first local bit line is interlaced with the third BLT control line, and the second local bit line is interlaced with the first BLT control line, the third BLT control line and the fourth BLT control line.

16. The memory cell array according to claim 4, wherein the first local bit line is interlaced with the first BLT control line but is not interlaced with the second BLT control line, and the second local bit line is interlaced with the first BLT control line and the second BLT control line.

17. The memory cell array according to claim 4, further comprising:
   a third local bit line;
   a third fixed value memory cell, which is coupled to the third local bit line, the second local bit line and the first BLT control line and programmed to a fixed value such that a threshold voltage of the third fixed value memory cell is greater than the threshold voltage of the first transistor;
   a fourth fixed value memory cell, which is coupled to the third local bit line, the second local bit line and the second BLT control line and programmed to a fixed value such that a threshold voltage of the fourth fixed value memory cell is greater than the threshold voltage of the second transistor;
   a fourth local bit line;
   a fifth fixed value memory cell, which is coupled to the first local bit line, the fourth local bit line and the first BLT control line and programmed to a fixed value such that a threshold voltage of the fifth fixed value memory cell is greater than the threshold voltage of the first transistor; and
   a sixth fixed value memory cell, which is coupled to the first local bit line, the fourth local bit line and the second BLT control line and programmed to a fixed value such that a threshold voltage of the sixth fixed value memory cell is greater than the threshold voltage of the second transistor.

18. The memory cell array according to claim 4, further comprising:
   a third local bit line;
   a third fixed value memory cell, which is coupled to the third local bit line, the first local bit line and the second BLT control line and programmed to a fixed value such that a threshold voltage of the third fixed value memory cell is greater than the threshold voltage of the second transistor;
   a fourth local bit line; and
   a fourth fixed value memory cell, which is coupled to the fourth local bit line, the first local bit line and the first BLT control line and programmed to a fixed value such that a threshold voltage of the fourth fixed value memory cell is greater than the threshold voltage of the first transistor.

19. The memory cell array according to claim 18, further comprising:
   a virtual word line interposed between the main memory cell array and the selected array; and
   a fifth fixed value memory cell, which is coupled to the global bit line and the virtual word line and programmed to a fixed value such that a threshold voltage of the fifth fixed value memory cell is greater than the threshold voltage of the first transistor.

20. The memory cell array according to claim 1, wherein the memory cell array is a virtual ground array.

* * * * *